MICROWAVE AMPLIFIER

Filed April 18, 1962 4 Sheets-Sheet 1

DUDLEY C. BROWNELL
DONALD J. DICKENS
GARY R. HOFFMAN
DONALD W. MACGLASHAN
INVENTORS

BY
Killman, Smith & Lamb
ATTORNEYS

INVENTORS
DUDLEY C. BROWNELL
DONALD J. DICKENS
GARY R. HOFFMAN
DONALD W. MACGLASHAN
BY Killman, Smith & Lamb
ATTORNEYS DUDLEY C. BROWNELL
DONALD J. DICKENS
GARY R. HOFFMAN
DONALD W. MACGLASHAN
INVENTORS BY
Hillman, Smith & Lamb
ATTORNEYS DUDLEY C. BROWNELL
DONALD J. DICKENS
GARY R. HOFFMAN
DONALD W. MACGLASHAN
INVENTORS BY
Killman, Smith & Lamb
ATTORNEYS 3,248,662
MICROWAVE AMPLIFIER Dudley C. Brownell, Glen Arm, Donald J. Dickens and Gary R. Hoffman, Baltimore, and Donald W. MacGlashan, Timonium, Md., assignors to The Bendix Corporation, Baltimore, Md., a corporation of Delaware Filed Apr. 18, 1962, Ser. No. 188,433
10 Claims. (Cl. 330—61)

This invention relates to amplifiers and more particularly to an amplifier for operation at microwave frequencies having unusually broad band characteristics and good stability.

The tunnel diode has demonstrated utility as an amplifying device for use at microwave frequencies because of its inherent response characteristics at these frequencies. It also has the advantage of requiring low power and permits great reduction in the size of amplifiers and the heat dissipation usually encountered with microwave receiving equipment, a considerable advantage where hundreds of such receivers may be used. Because of the reverse slope of its transfer characteristic over the most used portion of its operating range, it is often referred to as a negative resistance device. A tunnel diode typically has two leads or terminals, the input signal and the voltage bias source each being connected across both terminals, but isolated from each other. The output signal may appear at the same terminals as the input signal as a reflected wave. This obviously makes it necessary to provide means for separating the input and output signals. One such means which is used is the ferrite circulator which utilizes the biasing effect of a magnet on ferrite material to cause current flowing through an adjacent conductor to flow primarily in one direction. Typically, such a circulator is cylindrical with a flat, circular conductor through which current flows in only one direction. Such a circulator may have conductors leading to three ports, input current flowing from a first port to a second port connected to the tunnel diode, and the output from the diode flowing back into the second port and out of the third port. In this manner the circulator acts to separate the input signal from the output and to prevent the output signal from degrading the input signal. Ferrite circulators have imposed their own limitations on the amplifiers, however, particularly so far as bandwidth is concerned. It is, therefore, an object of the present invention to provide an amplifier of the type described including a ferrite circulator in which the bandwidth is considerably broader than is typical of amplifiers presently available.

It is another object of the present invention to provide an amplifier of the type described which meets the above objective and which is also more stable than is typical of currently available amplifiers.

It is another object of the present invention to provide an amplifier which meets the above objectives and which has a better signal-to-noise ratio than is normally experienced from an amplifier of this type.

It is another object of the present invention to provide an amplifier which meets the objectives above and which provides means for increasing the amplifier gain without resort to changing of input transformers.

It is a further object to provide an amplifier meeting the above objectives which is inexpensive and of small physical size and weight.

It is a further object of the present invention to provide an amplifier meeting the above objectives in which the power requirements and heat dissipation are low.

Other objects and advantages will become apparent from the following specification, taken in connection with the accompanying drawings, in which.

Figure 1:
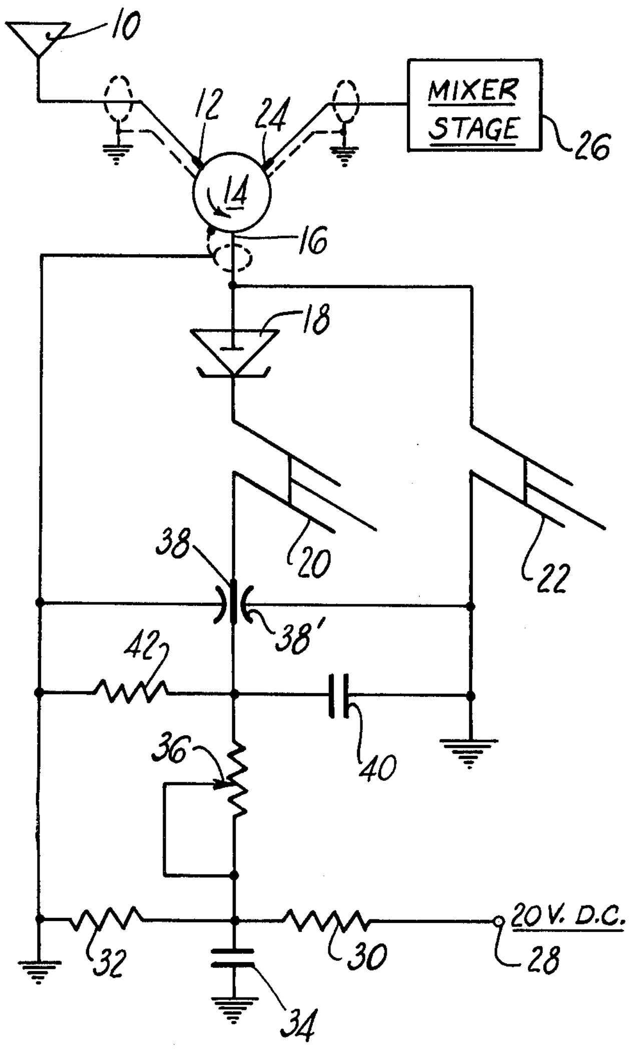
FIG. 1 is a schematic drawing of our amplifier.

Referring now to FIG. 1, a microwave signal is received at an antenna 10 and is supplied to a terminal 12 of a ferrite circulator 14 which is so biased by magnetic means that the input current travels around the circulator only in one direction, as indicated by the arrow, and flows out of a port or terminal 16 connected to a tunnel diode 18. The diode 18 is tuned by means of a shunt and series stub combination consisting of a tuning stub 20 connected in series with the tunnel diode 18 and a tuning stub 22 effectively connected across the diode 18 and the tuning stub 20. The output from the tunnel diode is reflected back into port 16 where it is directed around the circulator in the direction of the arrow, flowing out of a port 24 to a mixer stage 26 of the associated receiver. The shunt tuning stub 22 is inductive and is used to tune out the capacity of the case and the terminal of the tunnel diode 18. The series tuning stub is also inductive and is used to alter the diode negative resistance reflected to the diode input terminals. This series stub by changing the apparent negative resistance allows the gain of the amplifier to be increased without changing the diode D.C. bias from the minimum $Io/|G_D|$ point, the point where the minimum noise figure is obtained. ($Io$ is the D.C. bias current and $|G_D|$ is the magnitude of the negative conductance.) This arrangement allows the amplifier gain to be increased without having to resort to changing transformers. The upper limit to the series inductance is determined by the short circuit stability equation $$\frac{L_T}{|R_D|C_T} < R_T$$

when considered in the light of the diode resistance cutoff frequency, where:

$L_T$=total circuit inductance
$R_D$=diode negative resistance
$C_T$=total circuit capacitance
$R_T$=total positive circuit resistance From the foregoing we find that if the series inductance stub approaches a quarter wave length at any frequency below the diode resistance cutoff frequency, instability will result. For this reason the transformed negative resistance, hence the amplifier gain, can be increased by only a set amount. Although merely decreasing the electrical line length between the circulator and the amplifier will improve the stability, it is much more useful that the distance between the ferrite junction of the circulator and the amplifier be kept to less than one-quarter wave length since beyond this point the circulator may change from an inductive impedance to a capacitive impedance.

The direct current bias voltage is supplied from a source, not shown, to a terminal 28 and this voltage is reduced to a desired value by means of a voltage divider consisting of resistors 30 and 32. A conventional by-pass capacitor 34 by-passes undesirable alternating current components to ground, thus keeping them out of the direct current power supply. A variable resistor 36 provides a means for varying, over a desired range, the D.C. bias on the tunnel diode 18. It is necessary, in biasing the tunnel diode 18 to by-pass both high frequencies and low frequencies. To do this adequately, both by-passing arrangements must be as close to the diode as possible. The high frequency by-pass consists of a capacitor consisting of a pair of parallel plates 38, 38' separated by an appropriate dielectric material, typically ruby mica.

The low frequency by-pass function is supplied by a capacitor 40 which prevents any ripple from the power supply from causing instability. Another requirement for stability is that the power supply impedance be terminated at the diode so that the inductance associated with the power supply leads may be eliminated. A resistor 42 provides this function and its value should be much less than the diode impedance, usually one-half or one-third as much.

Figures 2, 4:
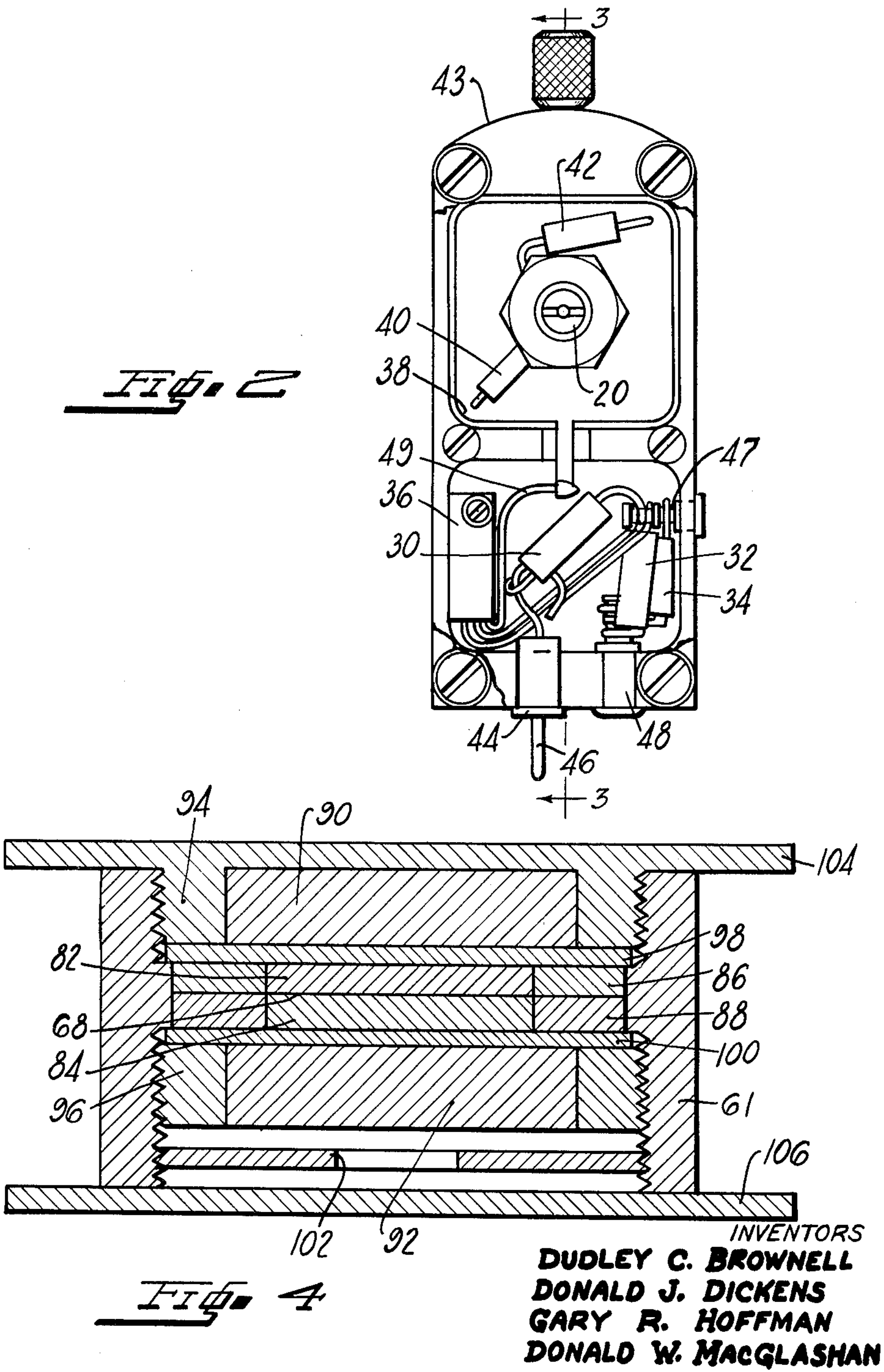
FIG. 2 is a plan view of our amplifier assembly with part of the cover broken away.
FIG. 4 is a vertical section taken through the ferrite circulator on line 4—4 of FIG. 3.
Figure 3:
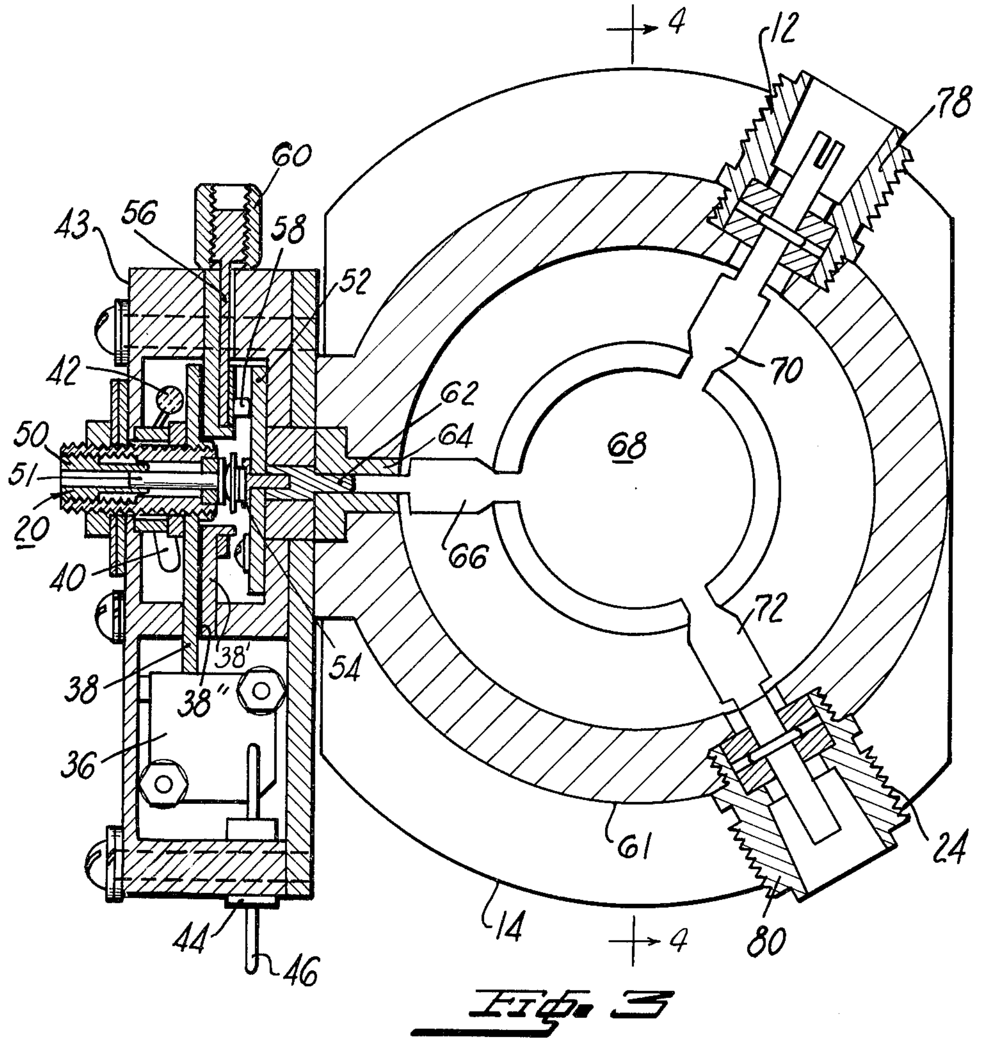
FIG. 3 is a sectional drawing of our amplifier assembly taken on line 3—3 of FIG. 2, together with the circulator assembly.

In FIG. 2 the amplifier section, minus the circulator is shown in plan view with part of the housing broken away to show details of the physical arrangement. The components are mounted in a block or housing 43 having a jack or terminal 44 for directing a conductor 46 to the resistor 30. Resistor 30 is connected to a terminal 47 to which is also wired resistor 32 and capacitor 34, both of which are grounded at their opposite ends to a terminal 48. The variable resistor 36 is attached to a sidewall of housing 43, as shown, and has one connection 49 to a capacitor plate 38 and second and third connections to terminal 47, as shown. As indicated above, it is necessary that the by-passing means be as close to the diode 18 as possible and it will be observed that capacitor 40 and resistor 42 are wired to plate 38 which is at bias potential and which is in direct contact with the diode 18 through the series stub 20. The high frequency by-pass capacitor 38 includes the ruby mica dielectric, 38'', and the ground potential plate 38' as shown in FIG. 3. The series tuning stub 20 includes a threaded member 50 having a screwdriver adjustment for moving itself axially along a conductor 51 to thereby tune the stub. The parallel connected tuning stub 22 includes a printed circuit board 52 having a deadend arcuate conductor pattern contacting a conductor 54 which supports the tunnel diode 18. The effective length of the arcuate conductor on board 52 is varied by means of a lever 56 pivotable on a collar forming part of ground plate 38' and including spring contact member 58 which rides on the arcuate conductor. The lever 56 and contact 58 are moved along the arcuate conductor by means of a handle 60 threadedly engaged with lever 56 so that it may be moved tightly against the housing 43 to hold the contact 58 in the desired position.

The ferrite circulator 14 includes a housing 61 which is connected to the amplifier housing 43 as shown. The connecting pin 62 projects into the bushing 64 and makes contact with an arm 66 of a Y-shaped conductor 68 formed with a circular center section. Arms 70 and 72 of conductor 68 project through ports 12 and 24, respectively in housing 61 in which are located electrical connectors 78 and 80. In FIG. 4, the conductor 68 is shown sandwiched between two ferrite discs 82 and 84, which discs are retained by means of ring-shaped members 86 and 88 of dielectric material. A pair of permanent magnet discs 90 and 92 are located near the ferrite members and serve as bias means therefor. These discs are retained in position by a pair of brass rings 94 and 96 which are threadedly engaged with the internal walls of the housing 61. Located between the ferrite members and the permanent magnet members are a pair of ground plates 98 and 100. A disc 102 of magnetic material is threadedly engaged with housing 61 and adjustable axially as a means of varying the magnetic field of the circulator. A pair of end plates 104, 106 are attached to housing 61 by any suitable fastening means, not shown.

Operation of our amplifier may best be understood by considering FIG. 1. A microwave signal received at antenna 10 is supplied to port 12 of the ferrite circulator which, because of the action of the magnetically biased ferrite, causes this input current to flow around the circulator in the direction of the arrow and out of port 16 where it is connected to the tunnel diode 18. The power for the diode 18 is supplied from a source, not shown, to a terminal 20 which is connected with a voltage dividing circuit consisting of resistors 30 and 32 and by-pass means consisting of a capacitor 34 for by-passing undesirable alternating current components to ground. The voltage level of the bias signal is adjustable by means of the variable resistor 36 from which it is supplied through the tuning stub 20 to the tunnel diode 18. Operation of the tunnel diode 18 is such that a reflected signal of greater voltage than the input signal is fed back to port 16 and the magnetic biasing effect of the circulator causes this reflected signal to appear at port 24 where it is supplied to the next stage which, in this case, is the mixer 26. It has been indicated above that the total length of the conductor from the ferrite junction of the circulator to the tunnel diode should be less than one-quarter wave length, if the desired stability and bandwidth characteristics are to be achieved. From FIGS. 2 and 3 it is apparent that the amplifier and circulator arrangement is such that this objective has been accomplished even for frequencies of the order of 1200 mc. The conventional connector such as members 78 and 80 has been eliminated at port 16 to reduce this length to the desired value. Obviously, the size and heat dissipation are greatly reduced as compared with conventional amplifiers used in this frequency range.

Figure 5:
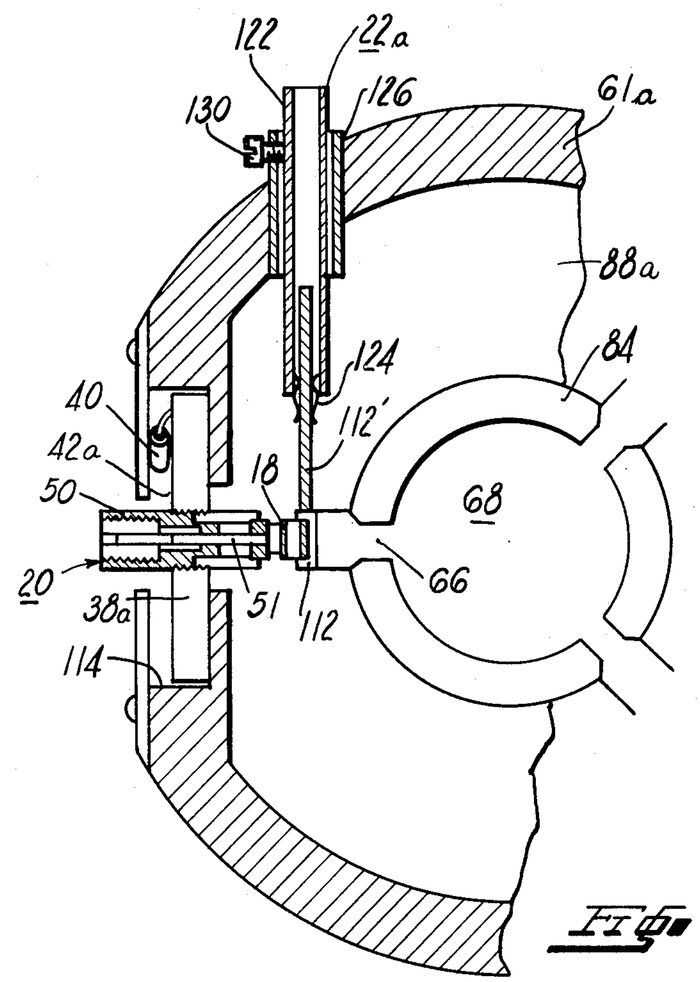
FIG. 5 is an enlarged sectional drawing of a modified form of our amplifier circulator assembly.

A modified form of our amplifier-circulator assembly in shown in FIG. 5. In this embodiment, the circulator is substantially the same as that shown in FIGS. 3 and 4 except that the housing and retaining rings have been drilled to permit the mounting of a number of amplifier components internally of the circulator housing. In describing this embodiment parts which are, or may be, identical with those in FIGS. 3 and 4 are given identical numbers and others which have been modified will be identified by subscripts. The conductor 68 is shown on top of the ferrite disc 84 which is held in position by a retaining ring **88*a* which is, in turn, located inside of housing 61*a*. The conductor arm 66 is, in this case, soldered or fastened to a retaining member 112 which supports the tunnel diode 18. The opposite side of the tunnel diode contacts the conductor 51 which forms part of the series tuning stub 20. Tuning may be effected by a screwdriver adjustment member 50 which telescopes over conductor 51 as in FIG. 3. A recess 114 is cut in the housing 61*a* to receive a button-type capacitor 38*a* which serves as a high frequency by-pass means identical to that of capacitor 38 and which is threadedly engaged with member 50 of tuning stub 20. This capacitor also includes a disc film resistor 42*a* which provides the same function as the tubular resistor 42. The recess 114 may also be made large enough to receive the low frequency by-pass capacitor 40. Attached to the retaining member 112 is a rod 112' forming part of the parallel tuning stub 22*a*. Telescoping over this arm is an axially movable sleeve 122 having a set of spring fingers 124 which make contact with rod 112' at varying locations along its length, thus tuning the parallel connected stub. Sleeve 122 is manually slidable in a port 126 in housing 61*a* and may be held in the desired position by means of a set screw 130. It will thus be apparent that with this configuration the length of the conductor between the ferrite junction and the tunnel diode is made shorter even than in the case of the embodiment shown in FIGS. 3 and 4. All of the portions of the amplifier which must be physically located very close to the tunnel diode are actually housed within the circulator. This leaves only the voltage divider resistors 30 and 32, by-pass capacitor 34 and the potentiometer 36** outside of the circulator housing.

While only a limited number of embodiments have been shown and described herein, modifications may be made without departing from the spirit and scope of the invention. If the reflected negative resistance of the amplifier is less than desired, it may be increased by adding a series capacity but this expedient is limited by the additional noise which is injected by the bias resistors due to inadequate radio frequency by-passing. This the decreased gain and the desired stability may be achieved at the expense of some increase in noise. Further, as compared with prior amplifier designs, these arrangements permit considerably greater variation in the selection of impedances at the amplifier port of the circulator to provide increased bandwidth capability.

We claim:

1. A low-noise negative resistance amplifier for use at microwave frequencies comprising a tunnel diode,
  a source of direct current power connected to said diode,
  variable reactance means connected to said diode; and
  a ferrite circulator having first connections to an input source of microwave signals, second connections across said tunnel diode and said series tuning stub, and third connections to an output device, said circulator including a conductor connected to all of said first, second and third connections, a ferrite member adjacent said conductor, a permanent magnet in close proximity to said ferrite member effective to magnetically bias said ferrite member to cause current to flow only in a direction from said first to said second connections and from said second to said third connections and to oppose flow in the opposite direction, said circulator being so constructed and arranged that the length of the conductor between said ferrite member and said tunnel diode is less than one-quarter wave length.

2. A low-noise negative resistance amplifier comprising a tunnel diode,
  biasing means for said tunnel diode comprising a low voltage direct current source and high frequency capacitance by-pass means,
  a first variable reactance tuning stub connected in series between said bias source and said tunnel diode,
  a second variable reactance tuning stub connected across said tunnel diode and said series stub, and
  a ferrite circulator connected across said tunnel diode and said series tuning stub, wherein the length of the input conductor from said tunnel diode to the ferrite junction of said circulator is less than one-quarter wave length.

3. A low-noise negative resistance amplifier as set forth in claim 2 wherein said second variable reactance tuning stub includes a printed circuit board with a deadend conductor operatively connected to said diode, a contact, and a manually operable lever for moving said contact along said conductor to vary the effective length of said stub.

4. A low-noise negative resistance amplifier as set forth in claim 3 wherein said circulator includes a conductor having a first connection to a source of microwave signals, a second connection to said tunnel diode and a third connection to an external utilization circuit,
  a ferrite member adjacent said conductor, and a permanent magnet in close proximity to said ferrite member effective to magnetically bias said ferrite member to cause current to flow in said conductor only in a direction from said first to said second connection and from said second to said third connection and to oppose flow in the opposite direction.

5. A low-noise negative resistance amplifier comprising a housing of conductive material,
  a tunnel diode in said housing,
  a power source for said tunnel diode including a low voltage direct current source, variable resistance means in said housing connected to said source, high frequency capacitance by-pass means in said housing including a metal plate maintained at substantially the voltage on said tunnel diode and a ruby mica dielectric layer isolating said plate from ground potential, and low frequency capacitance by-pass means,
  a first variable reactance tuning stub connected in series between said bias source and said tunnel diode including a first conductive member in contact with said diode and a second conductive member in telescoping relation to said first conductor and movable relative thereto,
  a second variable reactance tuning stub connected across said tunnel diode and said series tuning stub, and
  a ferrite circulator connected across said tunnel diode and said series tuning stub wherein the input connection from the ferrite junction of said circulator is less than one-quarter wave length.

6. A low-noise negative resistance amplifier as set forth in claim 5 wherein said second variable reactance tuning stub includes a printed circuit board with a deadend conductor operatively connected to said diode, a contact, and a manually operable lever for moving said contact along said conductor to vary the effective length of said stub.

7. A low-noise negative resistance amplifier as set forth in claim 6 wherein said circulator includes a conductor having a first connection to a source of microwave signals, a second connection to said tunnel diode and a third connection to an external utilization circuit,
  a ferrite member adjacent said conductor, and a permanent magnet in close proximity to said ferrite member effective to magnetically bias said ferrite member to cause current to flow in said conductor only in a direction from said first to said second connection and from said second to said third connection and to oppose flow in the opposite direction.

8. A low-noise negative resistance amplifier for use at microwave frequencies comprising a tunnel diode,
  biasing means for said tunnel diode comprising a low voltage direct current source and high frequency capacitance by-pass means,
  a variable reactance tuning stub connected in series between said bias source and said tunel diode,
  a second variable reactance tuning stub connected in parallel with said tunnel diode and said series stub; and
  a ferrite circulator having first connections to an input source of microwave signals, second connections across said tunnel diode and said series tuning stub, and third connections to an output device, said circulator including a conductor connected to all of said first, second and third connections, a ferrite member adjacent said conductor, a permanent magnet in close proximity to said ferrite member effective to magnetically bias said ferrite member to cause current to flow only in a direction from said first to said second connections and from said second to said third connections and to oppose flow in the opposite direction, said circulator being so constructed and arranged that the conductor between said ferrite member and said tunnel diode is less than one-quarter wave length.

9. A low-noise negative resistance amplifier as set forth in claim 8 wherein said second variable reactance tuning stub includes a printed circuit board with a deadend conductor operatively connected to said diode, a contact, and a manually operable lever for moving said contact along said conductor to vary the effective length of said stub.

10. A low-noise negative resistance amplifier for use at microwave frequencies comprising a housing of electrically conductive material;
  a conductor in said housing having connections with first, second and third ports in said housing;
  a ferrite member adjacent said conductor;
  permanent magnet means in close proximity to said ferrite member effective to magnetically bias said ferrite member to cause current to flow in said conductor only in a direction from said first to said second port and from said second to said third port and to oppose flow in the opposite direction;
  a tunnel diode in said housing connected to said conductor adjacent said second port;

a bias source for said tunnel diode including a source of direct current voltage connected thereto;

a first tuning stub mounted in said second port and electrically connected in series between said source and said tunnel diode including a conductor operatively connected to said diode and a second conductor in telescoping relation to said first conductor and axially adjustable with respect to said first conductor;

a button-type high frequency by-pass capacitor effectively connected between said first tuning stub and said housing including resistance means also connected between said tuning stub and said housing;

low frequency capacitance by-pass means effectively connected between said tuning stub and said housing;

a passageway in said housing and a second tuning stub mounted in said passageway including a rod operatively connected to said diode on the opposite side from the first named conductor in said first tuning stub such that said second tuning stub is effectively connected in parallel with said tunnel diode and said first tuning stub, said second tuning stub also including an axially movable sleeve attending through said passageway and telescoping over said rod to tune said stub.

References Cited by the Examiner

UNITED STATES PATENTS

| | | | |
|---|---|---|---|
| 2,975,377 | 3/1961 | Price | 307—88.5 |
| 2,977,482 | 3/1961 | Sterzer | 330—4.9 |

OTHER REFERENCES

Chang et al.: Low Noise Tunnel-Diode, May 1960, Proceedings of IRE, pp. 854–858 relied upon.

ROY LAKE, *Primary Examiner.*

HERMAN KARL SAALBACH, *Examiner.*